(12) United States Patent
Huang

(10) Patent No.: US 9,748,718 B2
(45) Date of Patent: Aug. 29, 2017

(54) UNIVERSAL CONNECTION ADAPTER

(71) Applicant: Quanta Computer Inc., Taoyuan (TW)

(72) Inventor: Kuo-Chun Huang, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 0 days.

(21) Appl. No.: 14/865,969

(22) Filed: Sep. 25, 2015

(65) Prior Publication Data

US 2017/0093102 A1    Mar. 30, 2017

(51) Int. Cl.
  *H01R 12/00*    (2006.01)
  *H01R 27/02*    (2006.01)
  *H01R 12/72*    (2011.01)

(52) U.S. Cl.
  CPC ........... *H01R 27/02* (2013.01); *H01R 12/721* (2013.01)

(58) Field of Classification Search
  CPC .............................. H01R 27/02; H01R 12/721
  USPC ......... 439/78, 692, 629, 76.1; 361/785, 760, 361/749
  See application file for complete search history.

(56) References Cited

U.S. PATENT DOCUMENTS

| | | | | |
|---|---|---|---|---|
| 3,676,746 A * | 7/1972 | Kassabgi | ............... | H05K 1/141 361/749 |
| 5,250,758 A * | 10/1993 | Fjelstad | ................... | H02G 3/00 174/254 |
| 5,793,617 A * | 8/1998 | Dent | ...................... | H05K 1/117 361/785 |
| 6,650,533 B2 * | 11/2003 | Curtis | ................... | G11B 33/128 312/331 |
| 7,066,767 B2 * | 6/2006 | Liao | ....................... | H01R 27/02 439/13 |
| 7,764,508 B2 * | 7/2010 | Huang | ................ | G06F 15/7864 361/760 |
| 7,833,025 B2 * | 11/2010 | Voli | .................... | H01R 12/7047 439/573 |
| 8,570,760 B2 * | 10/2013 | Chen | ................... | H01R 12/7082 361/679.31 |

(Continued)

FOREIGN PATENT DOCUMENTS

CN    1904796 A    1/2007

OTHER PUBLICATIONS

Taiwanese Office Action for Application No. 105105511, dated Apr. 14, 2017, w/ First Office Action Summary.

*Primary Examiner* — Abdullah Riyami
*Assistant Examiner* — Nader Alhawamdeh
(74) *Attorney, Agent, or Firm* — Nixon Peabody LLP; Eduardo J. Quinones; Zhou Lu

(57) ABSTRACT

A connection adapter is provided. In certain configurations, the connection adapter includes an input portion with a plurality of sets of input connectors, a first output portion extending from the input portion in a first direction and including a first set of output connectors, and a second output portion extending from the input portion in a second direction and including a second set of output connectors. In the connection adapter, the sets of input connectors are electrically coupled to each of the first set of output connectors and the second set of output connectors. Further, the first and second directions are substantially perpendicular to each other, while the input portion extends in a third direction that is not substantially perpendicular to the first direction or the second direction.

22 Claims, 10 Drawing Sheets

(56) References Cited

U.S. PATENT DOCUMENTS

| | | | | |
|---|---|---|---|---|
| 8,749,986 B1* | 6/2014 | Peterson | ............... | H05K 1/117 174/254 |
| 2008/0188098 A1* | 8/2008 | Boesch | ............... | H05K 9/0056 439/74 |
| 2010/0073829 A1* | 3/2010 | Baxter | ................ | G08B 17/06 361/42 |
| 2010/0128459 A1* | 5/2010 | Loibl | ................ | B60R 16/0239 361/829 |
| 2013/0088843 A1* | 4/2013 | Cong | .................. | G06F 1/185 361/785 |
| 2014/0051269 A1* | 2/2014 | Chang | ............... | H01R 12/722 439/68 |
| 2014/0104776 A1* | 4/2014 | Clayton | ............... | H05K 1/181 361/679.31 |
| 2014/0140025 A1* | 5/2014 | Han | .................. | H05K 7/1445 361/760 |

* cited by examiner

UNIVERSAL CONNECTION ADAPTER

FIELD OF THE INVENTION

The present technology relates to testing and debugging of computing devices, and more specifically to a universal connection adapter and use thereof for the testing and debugging of computing device.

BACKGROUND

Testing of computing devices, such as server devices, is an essential part of the development and manufacturing of computing devices. Typically, aside from quality control testing of computing devices, there may be situations in which more advanced or detailed testing of a computing device and the components therein may be required for prototyping and/or debugging purposes. However, in some instances, additional components may be required to perform the necessary testing. For example, in some types of server rack systems, the individual server sleds do not include a power supply. Rather, the server rack provides power via some type of connector to the individual server sleds. Therefore, to perform testing of such computing devices at a technician's bench, it is necessary to provide a power supply in order to operate and test the computing device.

However, there are limitations on the number of computing devices that can be tested simultaneously at the technician's bench using conventional methods and tools. For example, in some cases, the combination of the power supply and the computing device to be tested can require a large amount of space. Thus, only a limited number of computing devices can be tested at the same bench. In another example, different types of computing devices can require different parts or adapters to connect the power supply thereto and such parts or adapters may be limited in number. Thus, the technician may have insufficient parts to carry out testing on multiple computing devices.

SUMMARY

Additional features and advantages of the present technology will be set forth in the description that follows, and in part will be obvious from the description, or can be learned by practice of the herein disclosed principles. The features and advantages of the present technology can be realized and obtained by means of the instruments and combinations particularly pointed out in the appended claims. These and other features of the present technology will become more fully apparent from the following description and appended claims, or can be learned by the practice of the principles set forth herein.

Embodiments of the present technology concern a new connection adapter design and connection adapters therefrom. In certain embodiments, the new design connection adapter design is for power adapters. The new design includes an input portion with multiple sets of input connectors, a first output portion extending from the input portion in a first direction and having a first set of output connectors, and a second output portion extending from the input portion in a second direction and having a second set of output connectors. These portions can be part of a printed circuit board design. In the connection adapter design, the input connectors are electrically coupled to each of the output connectors. Further, the first direction and the second direction are substantially perpendicular to each other, while a third direction for the input portion is separated from the first direction and the second direction by an obtuse angle. Such a design permits use of multiple ones of the connection adapter with a computing device and power supply connected thereto to provide a high packing density for connection adapters, computing devices, and power supplies on a test bench.

The sets of input connectors can be configured to be of the same or different type and can further be arranged in different orientations on the input portion. Similarly, the sets of output connectors can be of different connector types and can be shaped or sized differently or different computing devices.

In some configurations, the different sets of connector can be coupled together. In such cases, a power transfer interconnect can be used to share power between different connection adapters. The power transfer interconnect can be utilized to connect dedicated power transfer terminals coupled to the sets of connector or to connect unused ones of the set of connectors.

In some configurations, the connection adapter design can include components and circuitry for controlling or adjusting signals between the sets of connectors.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1:
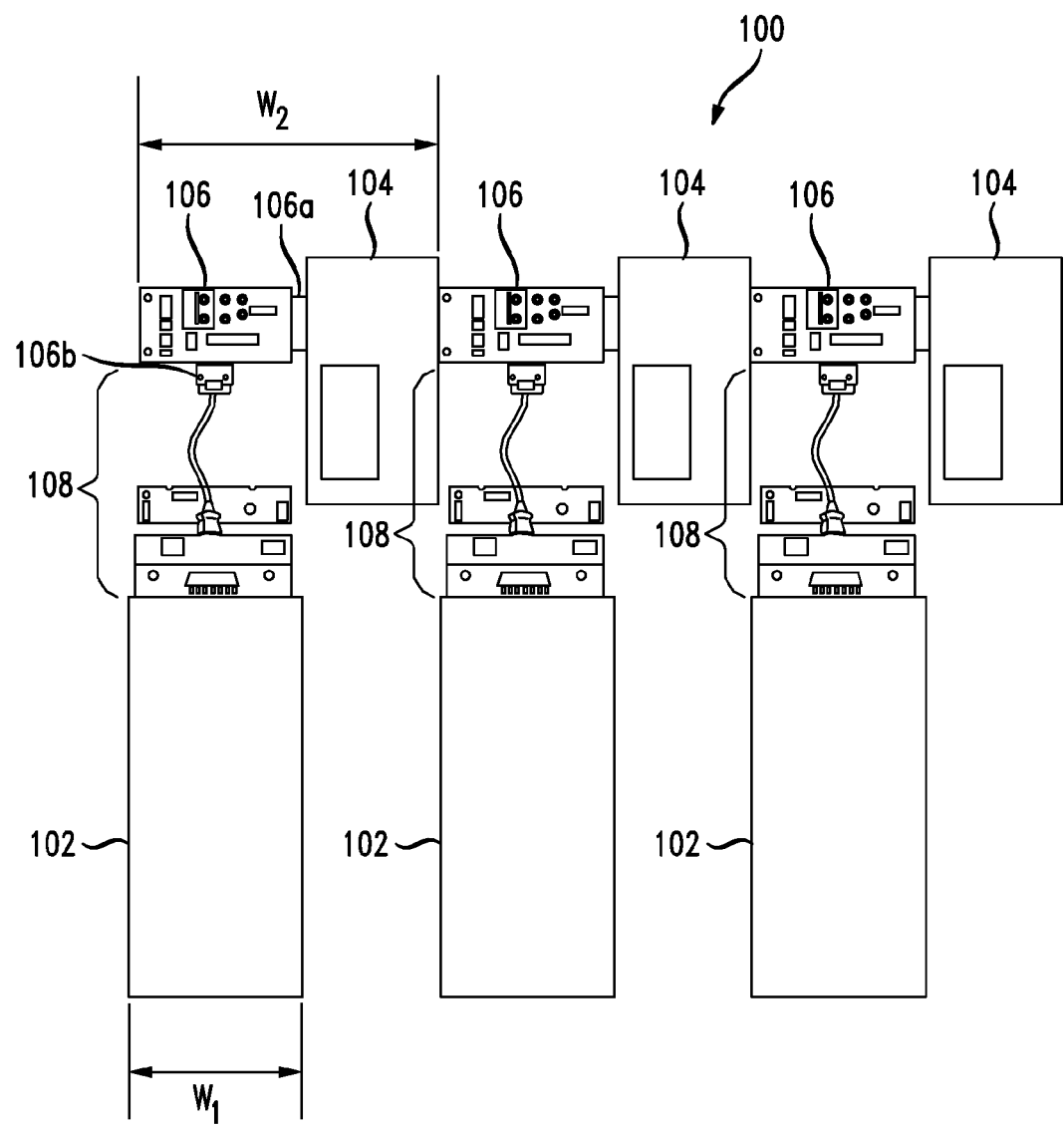
FIG. 1 shows a conventional bench arrangement of computing device for testing purposes.

The present technology is described with reference to the attached figures, wherein like reference numerals are used throughout the figures to designate similar or equivalent elements. The figures are not drawn to scale and they are provided merely to illustrate the instant present technology. Several aspects of the present technology are described below with reference to example applications for illustration. It should be understood that numerous specific details, relationships, and methods are set forth to provide a full understanding of the present technology. One having ordinary skill in the relevant art, however, will readily recognize that the present technology can be practiced without one or more of the specific details or with other methods. In other instances, well-known structures or operations are not shown in detail to avoid obscuring the present technology. The present technology is not limited by the illustrated ordering of acts or events, as some acts may occur in different orders and/or concurrently with other acts or events. Furthermore, not all illustrated acts or events are required to implement a methodology in accordance with the present technology.

As noted above, a technician involved in the testing, debugging, and prototyping of computing devices is often limited by bench space restrictions, equipment restrictions, or a combination of both. This is illustrated with respect to FIG. 1. FIG. 1 shows a conventional bench arrangement 100 of computing devices for testing purposes. In particular, FIG. 1 shows a bench arrangement 100 for the testing of server devices or server sleds 102 which might be used in a rack server system.

As shown in FIG. 1, arrangement 100 includes three of server sleds 102. Additionally arrangement 100 include a power supply unit (PSU) 104 for providing power to each of the server sleds 102 during testing procedures. To provide the power from the PSUs 104 to the server sleds 102, a connection adapter 106 can be provided. As shown in FIG. 1, the conventional connection adapter 106 is typically a rectangular printed circuit board (PCB) with connectors 106a, 106b extending therefrom. The PSU 104 can be coupled to a first connector 106a and the server sled 102 can be coupled to a second connector 106b. In some cases, a connector assembly 108 is utilized to provide the coupling between the server sled 102 and the second connector 106b.

However, a problem typically encountered using conventional connection adapters is that the combined width ($W_2$) of the PSU 104 and the connection adapter 106 exceeds the width ($W_1$) of the server sled 102. In some cases, the difference in width can be significant. For example, in certain cases, $W_2 \sim 2 \times W_1$. As a result, a significant amount of bench space may be wasted and the number of server sleds 102 than can be simultaneously tested on the bench may be limited.

As noted above, in addition to space restrictions, a technician can face parts restrictions. For example, in the case of server sleds which are powered externally, there can be several types of connectors in use. Thus, this can require different connection adapters for each type of server sled. However, as it is impractical (and potentially costly) to maintain a large supply of different connection adapters for each type of connector and thus the number of available connection adapters may be limited. Thus, there may be circumstances in which adequate bench space is available, but the technician simply lacks the necessary parts to test a large number of computing devices.

The present technology addresses the foregoing issues by implementing a new "universal" connection adapter design. The new connection adapter design is (1) configured for supporting various types of connectors (both input and output) and (2) has a physical design for allowing closer placement of computing devices and power supplies. Thus, the present technology eliminates the need for multiple connection adapters and reduces the amount of bench space needed for testing a computing device.

Although the various embodiments will be described primarily in terms of connection adapter design for supporting testing of server sleds, the present technology is not limited in this regard. Rather, the techniques discussed here can be utilized to implement connection adapters for testing of any other types of computing devices.

Figure 2A:
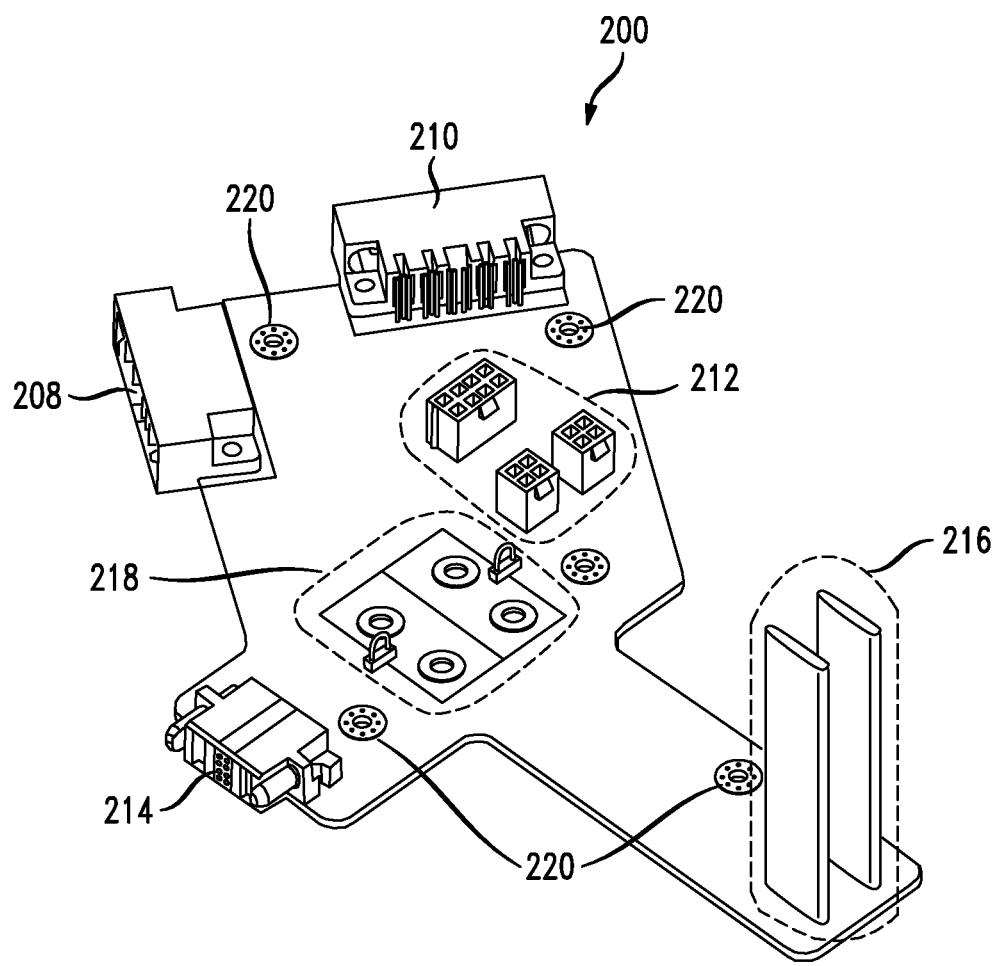
FIGS. 2A, 2B, and 2C show various views of a connection adapter in accordance with an embodiment of the present technology.
Figure 2B:
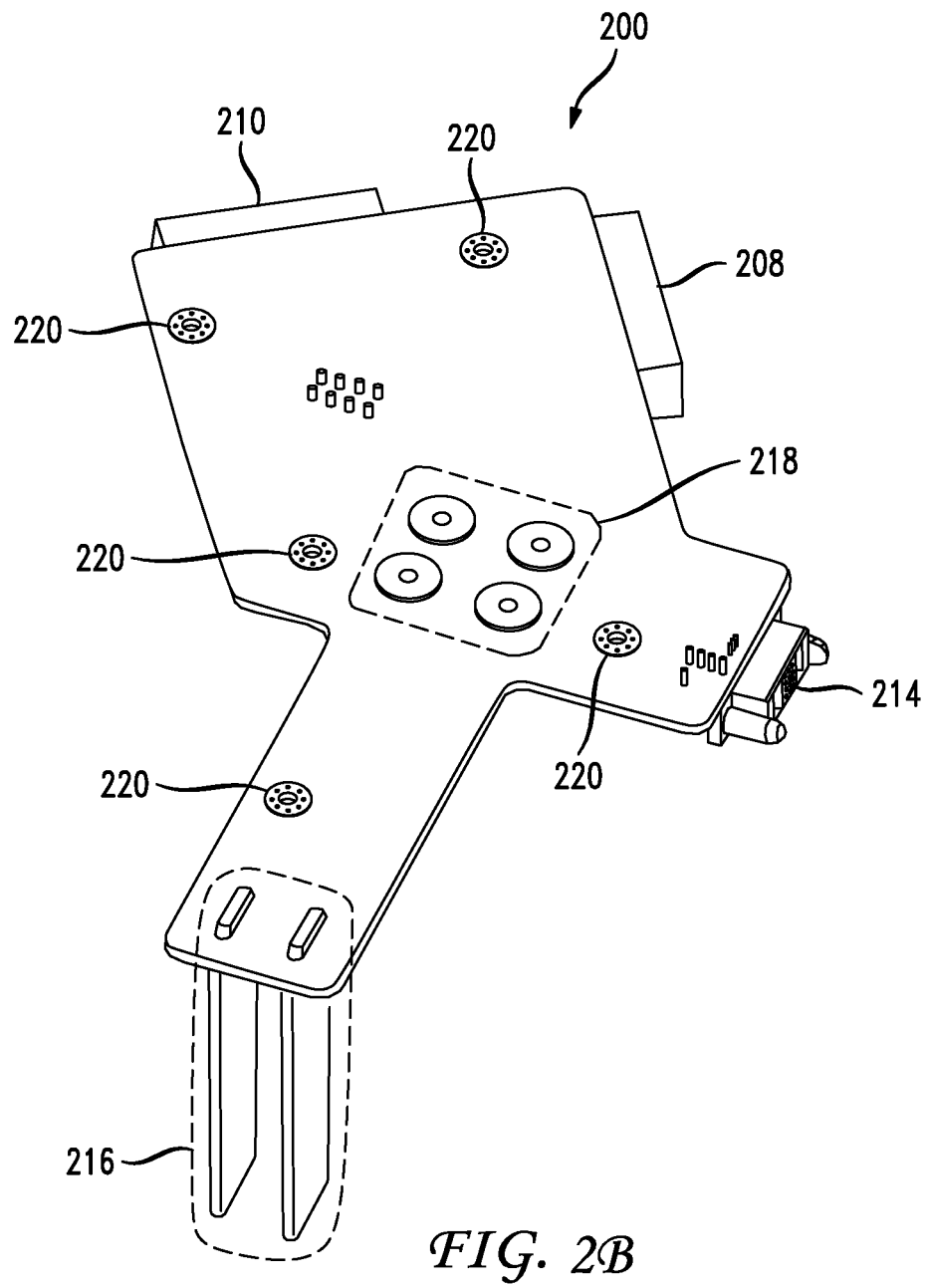
Figure 2C:
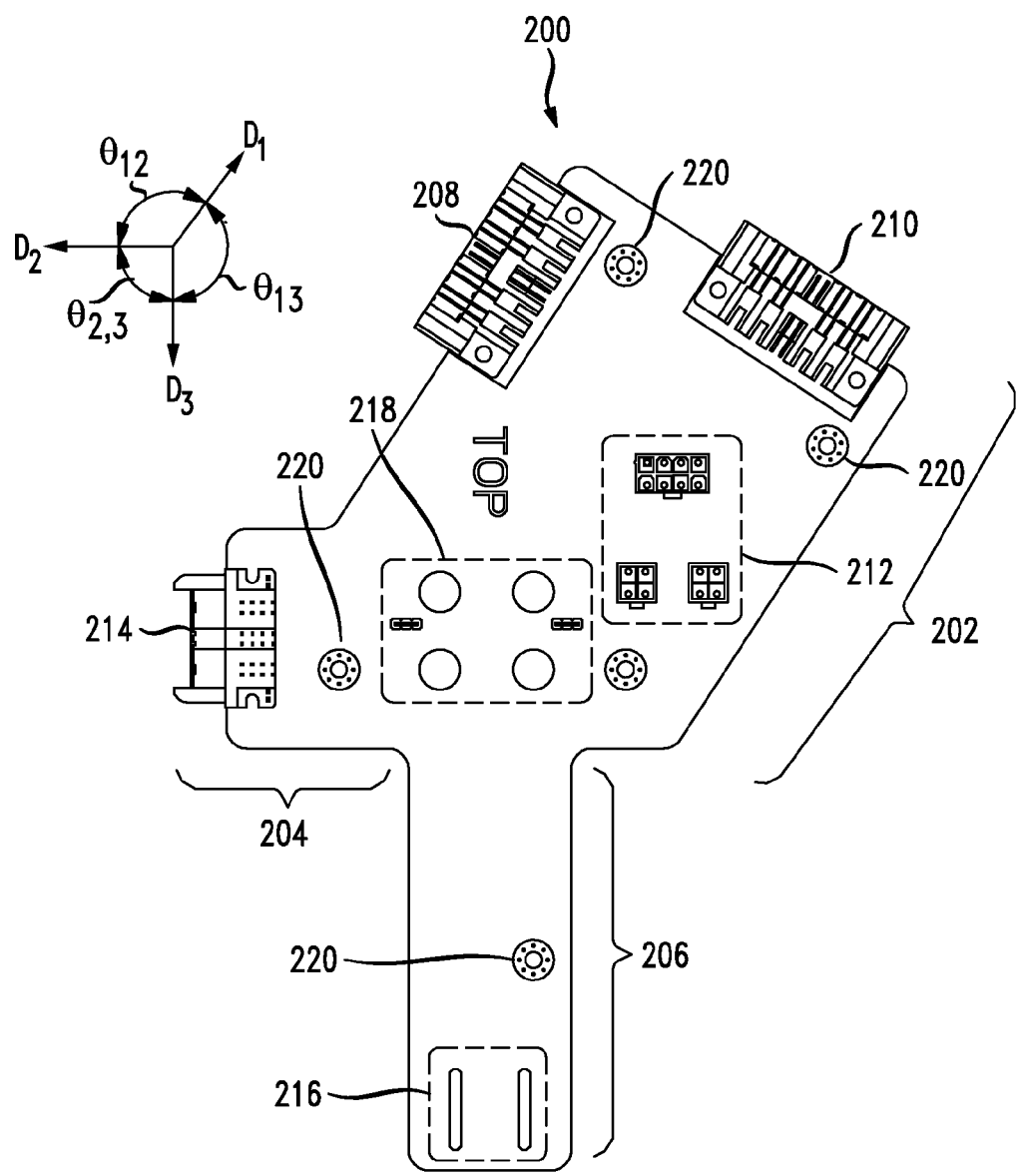

Turning first to FIGS. 2A, 2B, and 2C, there are shown various views of a connection adapter 200 in accordance with the present technology. FIG. 2A shows a top isometric view of connection adapter 200. FIG. 2B shows a bottom isometric view of connection adapter 200. FIG. 2C shows a top-down view of connection adapter 200. As shown in FIGS. 2A-2C, the connection adapter 200 includes an input or base portion 202, a first output portion 204, and a second output portion 206. In the exemplary implementation of FIGS. 2A-2C, connection adapter 200 is implemented via printed circuit board (PCB) techniques to provide a single PCB with the portions 202, 204, and 206 and any necessary electrical paths between the components mounted thereon (not shown), as well as ground terminals 220 for connecting a ground plane of the PCB to a reference voltage. However, the various embodiments are not limited in this regard. In some implementations, the portions 202, 204, and 206 can be implemented as separate components (including separate PCBs) and can be connected together via an appropriate set of connectors and fasteners. Further, the present disclosure contemplates that non-PCB technologies can be utilized to implement connection adapter 200.

As shown in FIGS. 2A-2C, the input portion 202, the first output portion 204, and the second output portion 206 are shown as being substantially rectangular components. However, the various embodiments are not limited in this regard and the present disclosure contemplates that the input portion 202, the first output portion 204, and the second output portion 206 can have other shapes. In some cases, the shape of a particular portion may be dictated by the types of server sleds to be connected thereto, as discussed in greater detail below with respect to FIGS. 5A and 5B.

Referring back to FIGS. 2A-2C, the input portion 202 is configured to receive power from various types of PSUs or other power supply devices. Thus, the input portion 202 can include a plurality of sets of input connectors, such as sets 208, 210, and 212. As shown in FIGS. 2A-2C, the sets 208, 210, and 212 can be configured to support various types of power supply connections. For example, the sets of connectors can be configured as socket/plug-type connectors along the edges of the input portion 202, such as with connector sets 208 and 210. Thus, the matching socket/plug connector of the power supply can be connected thereto by sliding the power supply into place and engaging either of set 208 and 210. In another example, the sets of connectors can be configured as socket/plug types connectors on a major surface of the input portion, as with connector set 212. Thus, the matching socket/plug connector of a cable from the power supply can be connected thereto by engaging connector set 212. However, the various embodiments are not limited to the illustrated output connector types and the present disclosure contemplates that a connection adapter in accordance with the present technology can support any other types of output connectors.

As noted above, the connection adapter 200 can also include output portions 204 and 206 extending from input portion 202. Each of output portions 204 and 206 can be configured to support a different type of output connector set to allow connection adapter 200 to support various types of server sleds. For example as shown in FIGS. 2A-2C, first output portion 204 is configured to include, at a distal end, a output connector set 214 for connecting to a corresponding connector of a server sled. As shown in FIGS. 2A-2C, output connector set 214 can be configured as a socket/plug connector type. In contrast, second output portion 206 is configured to include, at a distal end, a different connector type for output connector set 216. For example, as shown in FIGS. 2A-2C, output connector set 216 can be implemented as a set of bus bars, where the set of bus bars are configured to engaging with a corresponding bus bar connector of a server sled. However, the various embodiments are not limited to the illustrated output connector types and the present disclosure contemplates that a connection adapter in accordance with the present technology can support any other types of output connector sets at each of output portions 204 and 206.

In particular embodiments, the present disclosure contemplates that the input connector sets, 208, 210, and 212, and the output connector sets, 214 and 216, can be electrically coupled to each other. Thus, use may be simplified as the technician need only plug in a power supply to any of input connector sets 208, 210, and 212 in order to supply power at any of output connector sets 214 and 216. However, in other embodiments, controls can be provided. Such a configuration can be useful in cases where safety may be an issue, such as in the case of an exposed bus bar configuration. Such control can be implemented in a variety of ways. For example, in some cases, manual controls (e.g., switches, buttons, jumpers, etc.) can be provided for the user to select which of output connector sets 214 and 216 to energize. In other cases, the process can be automated. That is, the connection adapter 200 can include a controller configured for detecting which of output connector sets 214 and 216 is currently in use, and electrically isolate the other one of the connector sets 214 and 216.

As discussed above, the connection adapter 200 not only includes multiple types of connector sets for supporting different types of connectors, but is also physically designed to decrease the amount of space required for bench testing multiple computing devices. As shown in FIGS. 2A-2C, the connection adapter 200 is configured such that the input portion 202, the first output portion 204, and the second output portion 206 each extend in different directions ($D_1$, $D_2$, and $D_3$, respectively). For example, first output portion 204 and second output portion 206 extend in directions ($D_2$, $D_3$) that are approximately perpendicular to each other (i.e., $\theta_{23} \sim 90$ degrees). This permits selection of an appropriate output connector set by rotating the connection adapter by approximately 90 degrees.

However, in addition to the difference in direction between the first output portion 204 and second output portion 206, there is also a deliberate difference in direction between the input portion 202 and each of the first output portion 204 and the second output portion 206. In particular, the present disclosure contemplates that a difference ($\theta_{12}$, $\theta_{13}$) between a direction ($D_1$) of input portion 202 and each of the respective directions ($D_2$, $D_3$) for first output portion 204 and second output portion 206 defines an obtuse angle (i.e., $\theta_{12}$, $\theta_{13} > 90$ degrees). In some instances, an obtuse angle that is substantially greater than 90 degrees. For example, the difference can be between 120 and 150 degrees. In one particular embodiment, $\theta_{12}$ can be between 120 and 125 degrees, such as 123.2 degrees, and $\theta_{13}$ can be between 145 and 150 degrees, such as 146.8 degrees. This configuration allows for a greater packing density of the server sleds, PSUs, and connection adapters, as shown below in FIGS. 3 and 4.

Figure 3:
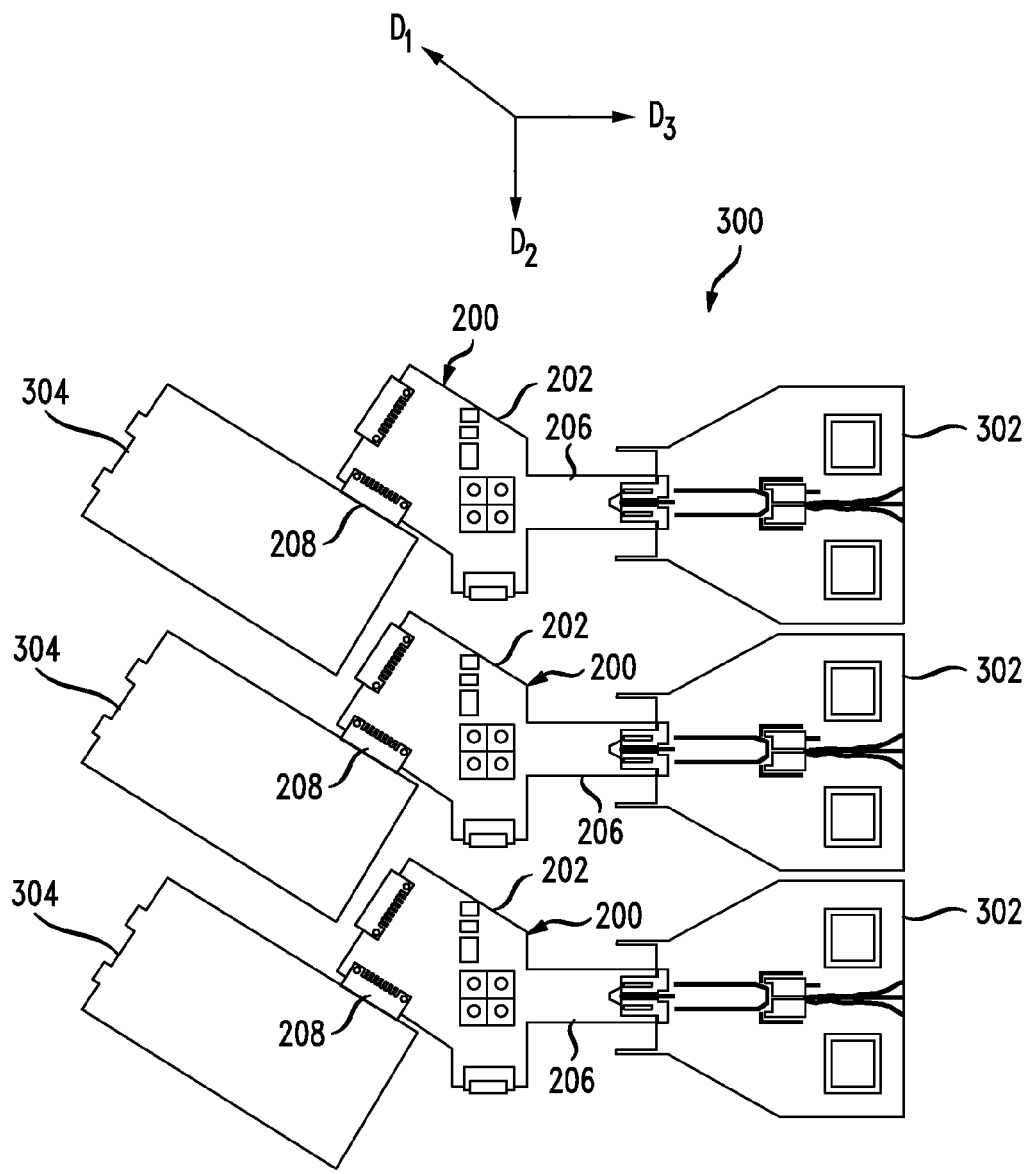
FIG. 3 shows a first exemplary bench arrangement using the connection adapter of FIGS. 2A-2C.

FIG. 3 shows a first exemplary bench arrangement 300 using the connection adapter of FIGS. 2A-2C. As shown in FIG. 3, three instances of connection adapter 200 are utilized to couple each of server sleds 302 to a respective one of PSUs 304. In arrangement 300, each of the server sleds 302 are configured for a bus bar connection. Thus, the connection adapters 200 are oriented such that the second output portion 206 engages with the bus bar connectors for each of server sleds 302. As to the PSUs 304, each is oriented and placed so as to engage with one of input connector sets 208 of connection adapters 200. In this way, each of connection adapters 200 can be used to deliver power from each PSUs 304 to one of server sleds 302 via input connector set 208 and output portion 206.

As can be observed from FIG. 3, the direction ($D_1$) of the input portion 202 of connection adapter 200 permits the PSUs 304 to be oriented at off-angles (i.e., not perpendicular or parallel) with respect to the direction of the server sleds 302 ($D_3$, the same as output portion 206). As a result, the PSUs 304 can be arranged with a higher packing efficiency and the space between the server sleds observed in FIG. 1 can be significantly reduced or eliminated, as shown in FIG. 3. As a result, a smaller portion of the bench is required to test server sleds 302. A similar result is shown when using the first output connector 214 of connection adapter 200. This is illustrated below in FIG. 4.

Figure 4:
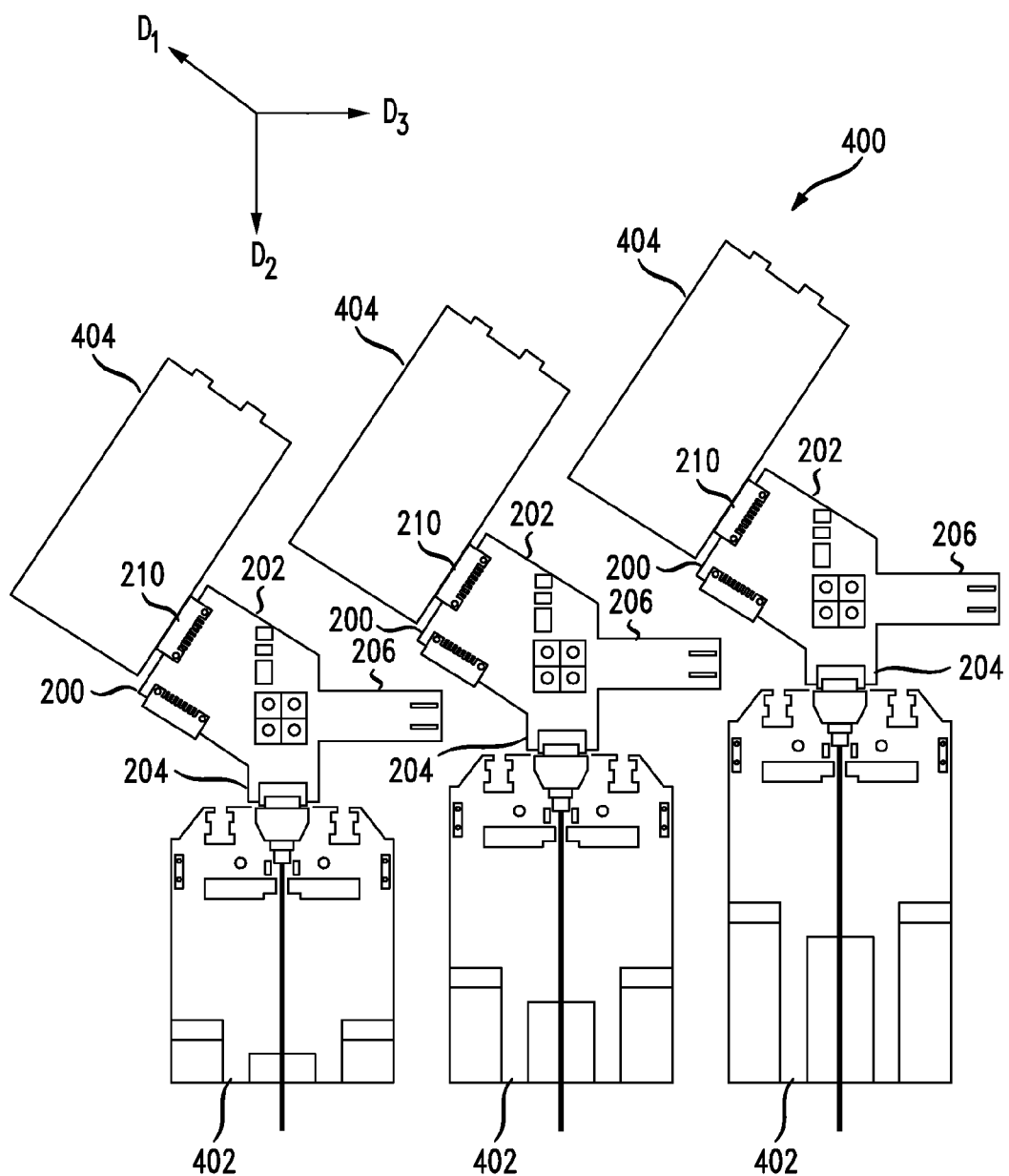
FIG. 4 shows a second exemplary bench arrangement using the connection adapter of FIGS. 2A-2C.

FIG. 4 shows a second exemplary bench arrangement 400 using the connection adapter of FIGS. 2A-2C. As shown in FIG. 4, three instances of connection adapter 200 are utilized to couple each of server sleds 402 to a respective one of PSUs 404. In arrangement 400, each of the server sleds 402 are configured for a socket/plug type connection. Thus, the connection adapters 200 are oriented such that the first output portion 204 engages with the corresponding connectors for each of server sleds 402. As to the PSUs 404, each is oriented and placed so as to engage with one of input connector sets 210 of connection adapters 200. In this way, each of connection adapters 200 can be used to deliver power from each PSUs 404 to one of server sleds 402 via input connector set 210 and output portion 204.

As can be observed from FIG. 4, the direction ($D_1$) of the input portion 202 of connection adapter 200 again permits the PSUs 404 to be oriented at off-angles (i.e., not perpendicular or parallel) with respect to the direction of the server sleds 402 ($D_2$, the same as output portion 204). As a result, the PSUs 404 can again be arranged with a higher packing efficiency and the space between the server sleds observed in FIG. 1 can be significantly reduced or eliminated, as shown in FIG. 4. As a result, a smaller portion of the bench is required to test server sleds 302.

It should be noted that the configuration of connection adapter 200 is provided not only for improving packing efficiency, but also to provide the technician flexibility is use. This is illustrated in FIGS. 5A and 5B.

Figure 5B:
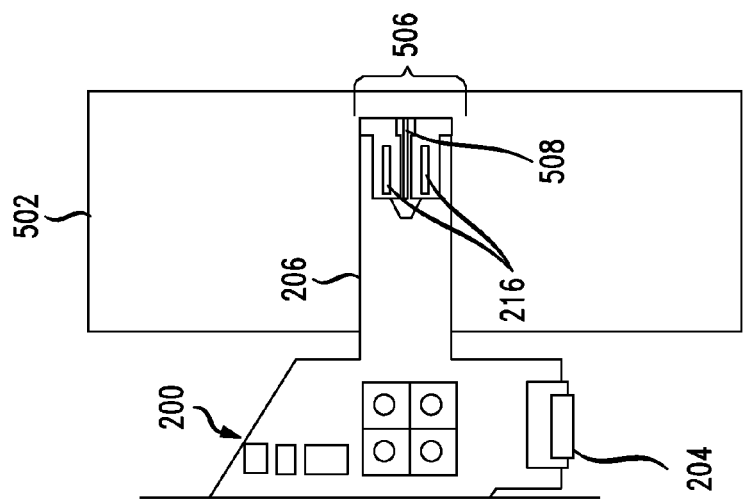
FIGS. 5A and 5B show a third exemplary bench arrangement using the connection adapter of FIGS. 2A-2C.
Figure 5A:
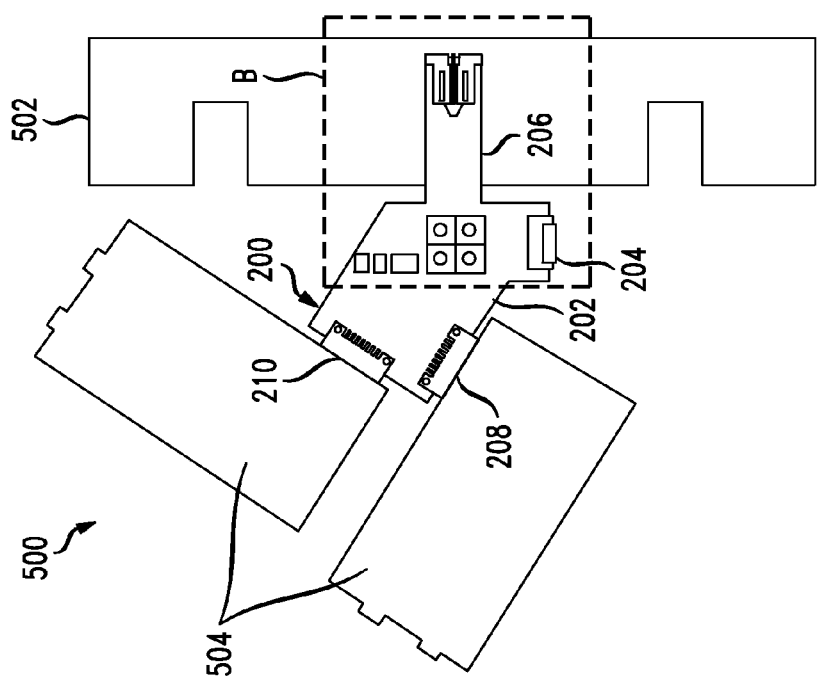

FIGS. 5A and 5B show a third exemplary bench arrangement 500 using the connection adapter of FIGS. 2A-2C. As shown in FIG. 5A, one instance of connection adapter 200 is utilized to provide power to a server sled 502. In arrangement 502, server sled 502 is configured for a bus bar type connection, similar to arrangement 300 in FIG. 3. Thus, the connection adapter 200 is oriented such that the second output portion 206 engages with the corresponding connectors of server sled 502.

As discussed above, one aspect of the flexibility of the connection adapter of the present technology is the ability to support various types of computing devices. In the case of connection adapter 200, the design of each of output portions 204 and 206 can be selected to provide compatibility with different configurations of server sleds, including different configurations of server sleds with a same connector type. This can be seen by comparing FIG. 3 versus FIGS. 5A and 5B. As can be seen from these figures, while a particular design for output portion 206 is not necessarily needed for engaging with sleds 302 in FIG. 3, a particular design is needed for engaging server sled 502 in FIGS. 5A and 5B. In particular, as illustrated in detail in FIG. 5B, the output portion 206 needs to be designed to fit in receiving slot 506 of server sled 502 and be of sufficient length so that the output connector set 216 on output portion 206 can engage with the corresponding connector 508 of server sled 508 when the output portion 206 is inserted into receiving slot 506. However, the various embodiments are not limited in this regard and the design of output portions can vary depending on the types of computing devices to be used.

Another aspect for supporting various types of computing devices involves providing the ability to support various power requirements for different types of computing devices. For example, a power supply may be capable of supporting computing devices with a wide range of voltages. Thus, the present disclosure contemplates that at least in some embodiments, the connection adapter can include components and circuitry for converting a voltage from the power supply to a desired output voltage. Additionally, such a connection adapter can also include manual controls (e.g., switches, buttons, jumpers, etc.) for selection of different voltages.

In addition to the foregoing, the present disclosure contemplates that a connection adapter in accordance with the present technology can include other types of components and circuitry for performing a variety of signal processing tasks in the various embodiments. For example, such tasks can include filtering, amplifying, de-amplifying, regulating, limiting, or any other conditioning or adjustment of the voltage or current being provided or the input impedance being presented. In such configurations, the connection adapter can be configured to perform such tasks automatically and/or provide controls for a user to provide manual control of such tasks.

In some cases, a single power supply will be unable to deliver sufficient power for an attached server sled. To address such issues, the present disclosure also contemplates that a connection adapter can therefore be configured to support the simultaneous use of multiple power supplies in particular embodiments. As discussed above, one potential configuration for a connection adapter in accordance with the present technology is to have all of the input connector sets tied together to all of the output connector sets. Such a configuration therefore not only allows a power supply coupled to a particular input connector set to provide power simultaneously at all of the output connector sets, but also permits a particular output connector set to receive power simultaneously from all of the input connector sets as well. As a result, a technician need only attach additional power supplies to the connection adapter. This is illustrated in FIG. 5A.

As shown in FIG. 5A, connection adapter 200 is shown with two PSUs 504 connected thereto via input connector sets 208 and 210. Thus, server sled 502 draws power from both of PSUs 504. In the exemplary embodiment of FIG. 5A, both of input connector sets 208 and 210 are shown as being substantially identical. Further, both of PSUs 504 are also shown as being substantially identical. Additionally, the placement of input connector sets 208 and 210 on input portion 202 is selected to allow connection of PSUs 504 with a high packing density. For example, input connector set 208 is placed on a first edge of input portion 202 and input connector set 210 is placed on a second, adjacent edge of input portion 202. Further, the placement of input connector set 210 on this second edge is selected such that when a one of PSUs 405 is connected thereto, the one of PSUs 504 does not interfere or even touch the other of PSUs 405 connected to input connector set 208. Further, the dimensions and geometry of power are selected to also ensure that neither of PSUs 504 interfere or touch a server sled 502 attached to the connection adapter 200.

It should be noted that although FIG. 5A illustrates a configuration in which multiple identical PSUs are attached via multiple identical input connector sets, the various embodiments are not limited in this regard. For example, in connection adapter 200, a power supply can be connected via any of input connector sets 208, 210, and 212 and thus power supplies can be connected to connection adapter 200 using any combination of input connector sets 208, 210, and 212. As a result, connection adapter 200 can support providing power using different types of power supplies or power supplies with different connector types.

In addition to supporting multiple power supplies via on connection adapter, the present disclosure also contemplates the opposite. That is, using power supply to support multiple connection adapters (provided the power supply can deliver sufficient power for the computing devices attached to such connection adapters). This is illustrated in FIGS. 6 and 7.

Figure 6:
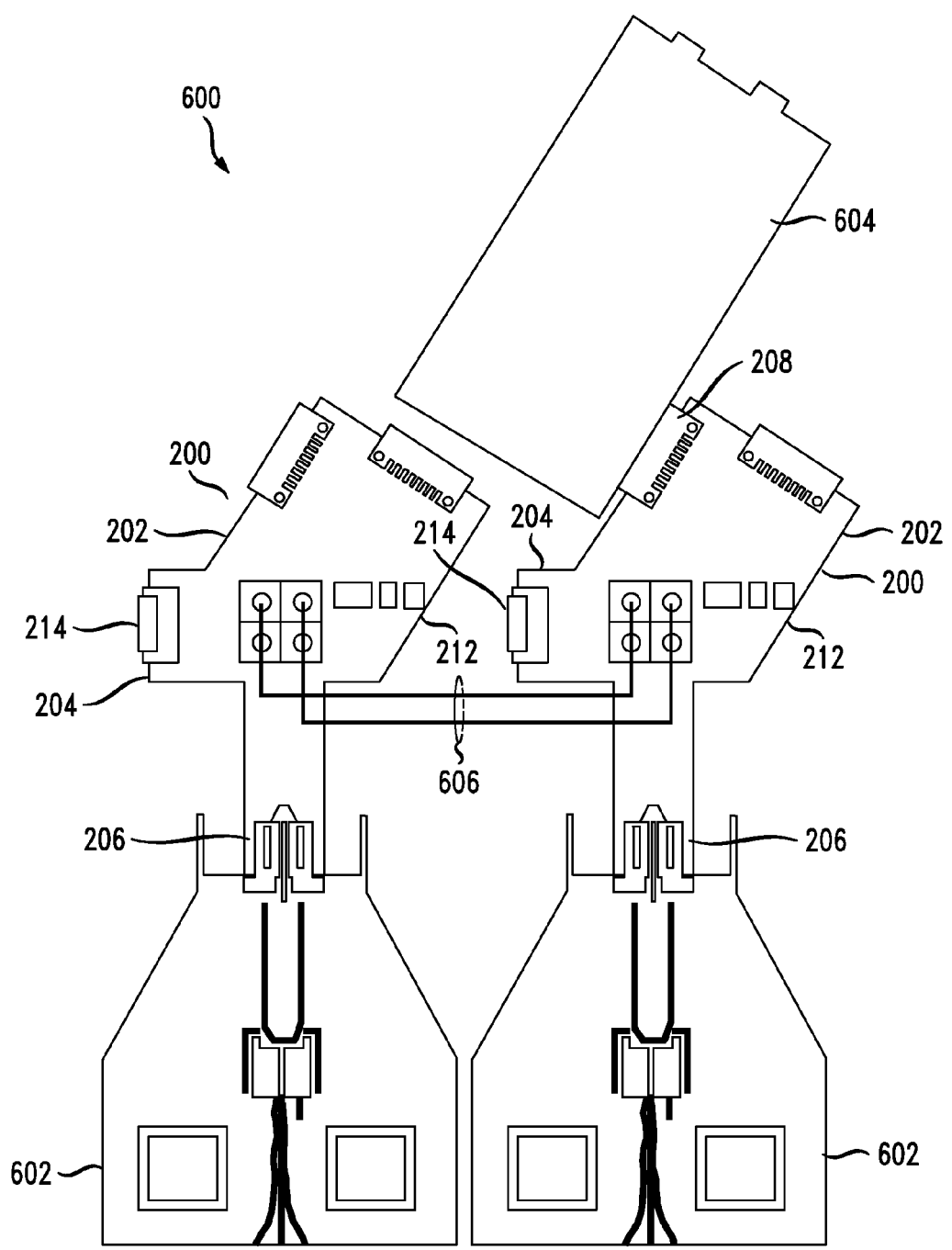
FIG. 6 shows a fourth exemplary bench arrangement using the connection adapter of FIGS. 2A-2C.

FIG. 6 shows a fourth exemplary bench arrangement 600 using the connection adapter of FIGS. 2A-2C. FIG. 7 shows a fifth exemplary bench arrangement 700 using the connection adapter of FIGS. 2A-2C. In arrangement 600, there are provided two instances of connection adapter 200, where each instance is coupled to a one of server sleds 602 via output portion 206. Similarly, in arrangement 700, there are also provided two instances of connection adapter 200, where each instance is coupled to a one of server sleds 702 via output portion 204. The connection and arrangement of server sleds and connection adapters in FIGS. 6 and 7 is similar to that described above with respect to FIGS. 3 and 4, respectively.

Figure 7:
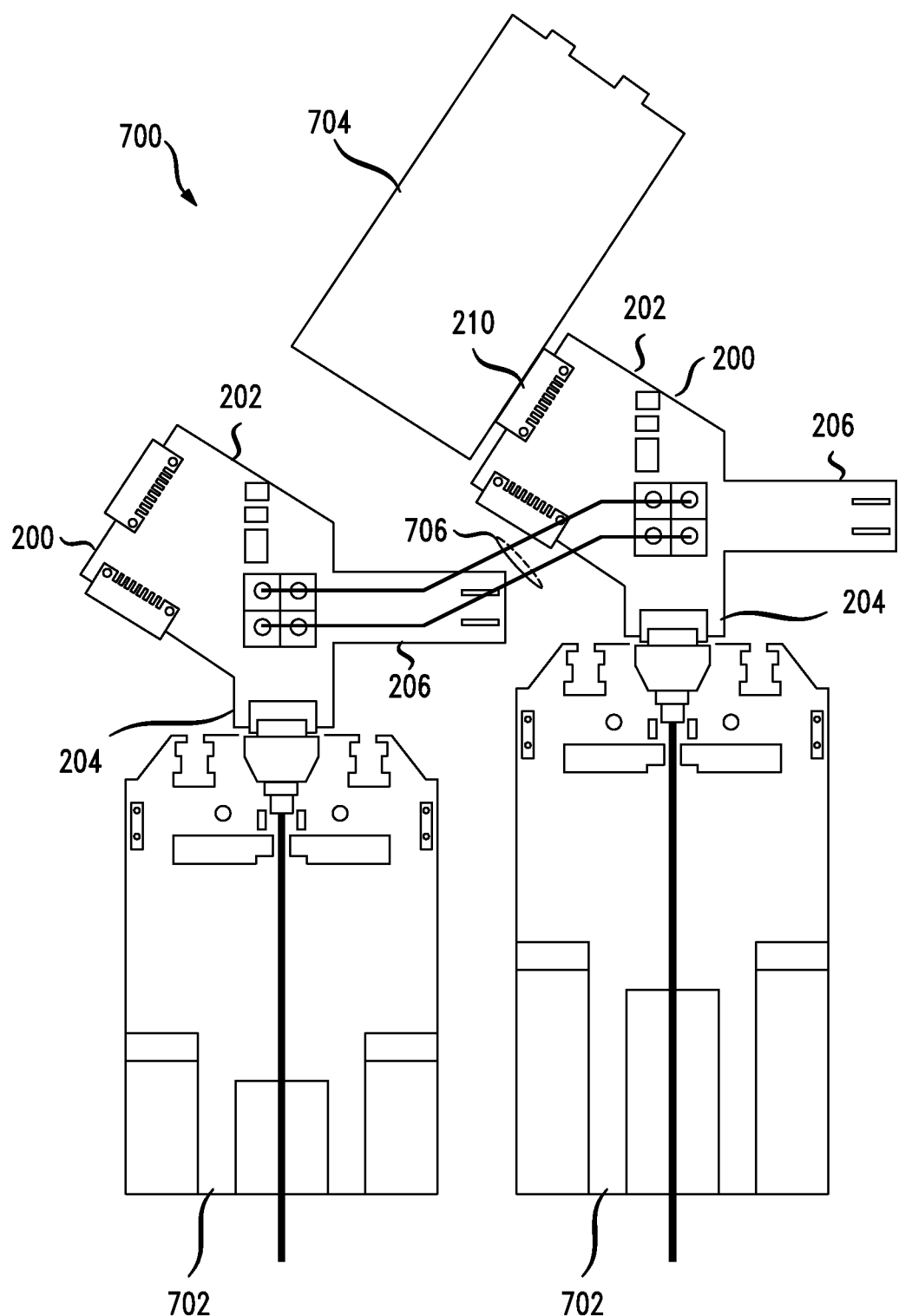
FIG. 7 shows a fifth exemplary bench arrangement using the connection adapter of FIGS. 2A-2C.

However, as shown in each of FIGS. 6 and 7, each of arrangements 600 and 700 involves a single PSU. For example, arrangement 600 includes a PSU 604 connected to a first of connection adapters 200 via input connector set 208 and arrangement 700 includes a PSU 704 connected to a first of connection adapters 200 via input connector set 210. In both cases, no PSU is provided for a second of connection adapters 200.

To address the scenario where power supply has sufficient power to support multiple connection adapters, the present disclosure contemplates that connection adapters in accordance with the various embodiments can be configured to be coupled together to share a power supply. In certain embodiments, this can be achieved via the inclusion of power transfer terminals 218, as illustrated in FIGS. 2A-2C. In such a configuration, a set of power transfer interconnects can then be utilized to supply power from the power transfer terminals 218 of first instance of connection adapter 200 to the power transfer terminals 218 of a second instance of connection adapter 200. For example, power transfer interconnects can be a set of cables or cable harness, another printed circuit board, a bus, or any other type of device for connecting power transfer terminals on different connection adapters. This is illustrated in FIGS. 6 and 7. For example, as shown in FIG. 6, a power transfer interconnect 606 is provided for connecting the first instance of connection adapter 200 to the second instance of connection adapter 200. In this way, power from PSU 604 is delivered to both instances of connection adapter 200, and thus to each of server sleds 602. Similarly in FIG. 7, a power transfer interconnect 706 is provided for connecting the first instance of connection adapter 200 to the second instance of connection adapter 200. In this way, power from PSU 704 is delivered to both instances of connection adapter 200, and thus to each of server sleds 702.

In some embodiments, the need for power transfer terminals can be eliminated by taking advantage of unused connector sets. For example, referring to back to FIG. 6, each instance of connection adapter 600 has unused connector sets, such as input connector sets 212, output connector sets 214, and unused ones of input connector sets 208 and 210 that are not blocked by PSU 604 or other components. Accordingly, a power transfer interconnect in accordance with the present technology can be configured to allow connection between such unused and available ones of connector sets in connection adapter 200. In some implementations, the power transfer interconnect can be configured to support interconnection between any combination of connector sets. For example, the power transfer interconnect can be a harness or set of cables with multiple connectors at each end to support any combination of connection adapter interconnections.

Although the various embodiments have been illustrated with respect to a specific PSU size, shape, and connector configuration, the various embodiments are not limited in this regard. The present disclosure contemplates that the connector adapter 200 and connector adapters in accordance other embodiments can be utilized with PSUs of different sizes and shapes and different connector configurations.

Additionally, to improve the flexibility of use of connector adapters in accordance with the present technology, the present disclosure contemplates that the design of connector adapter 200 can be modified to further improve the flexibility of the connection adapter. For example, as shown in FIGS. 2A-2C, the base portion 202 of adapter 200 includes three edges but has input connectors disposed along only two of these three edges. Further, as shown in FIGS. 3 and 4, for at least one of the connection adapters 200, the third edge without an input connector is exposed or otherwise accessible in such configurations. Accordingly, the present disclosure contemplates that the accessibility of this edge can be exploited to further enhance the capabilities of a connection adapter in accordance with the present technology. One potential variation is illustrated in FIG. 8.

Figure 8:
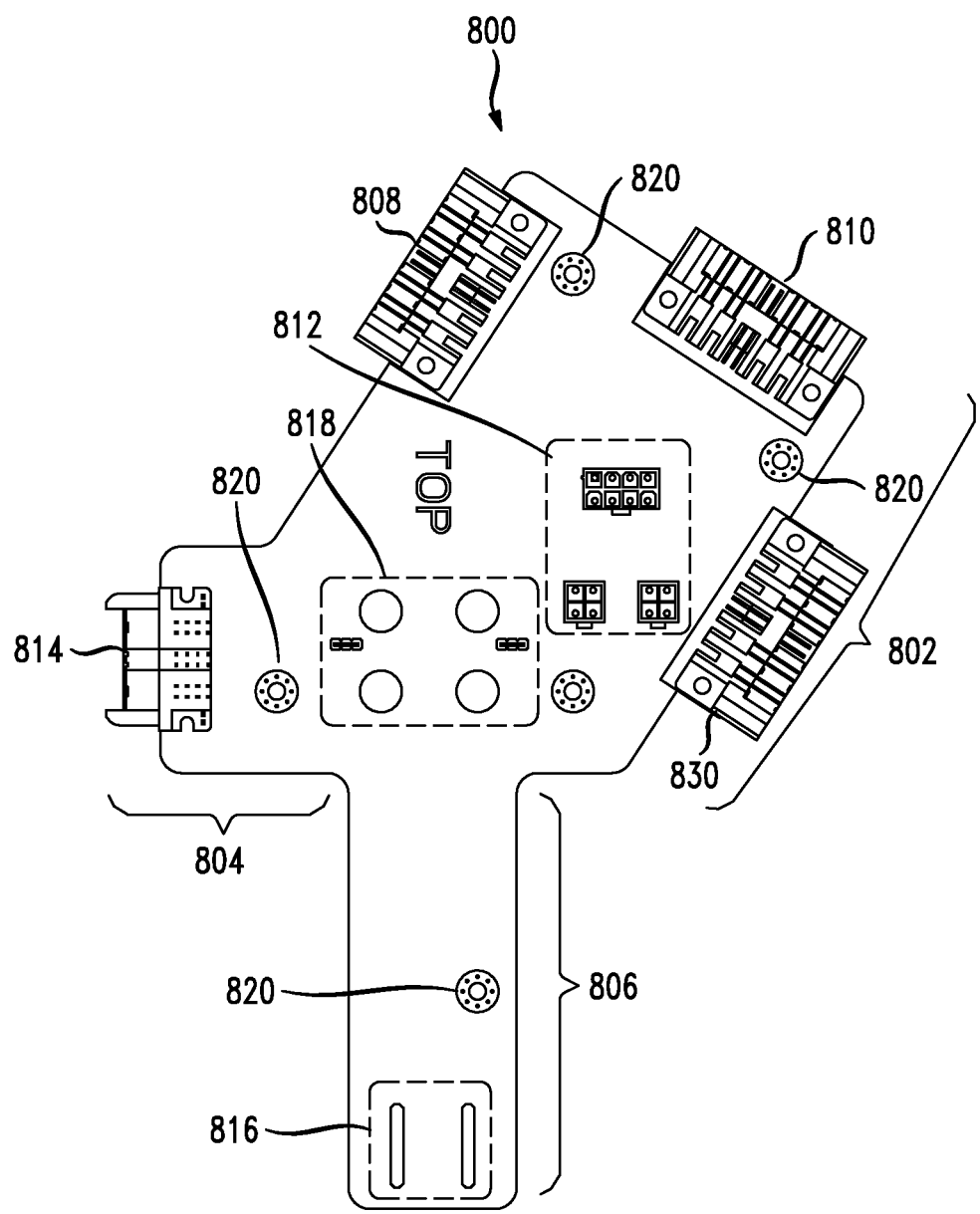
FIG. 8 show various views of a connection adapter in accordance with an alternate embodiment of the present technology.

FIG. 8 shows a top view of a connection adapter 800 according to an alternate embodiment of the present technology. Connection adapter 800 is configured substantially similar to connection adapter 200 in FIGS. 2A-2C, where elements 802-820 substantially correspond to elements 202-220 in FIG. 2. Accordingly, the preceding description of elements 202-220 of FIG. 2 is sufficient for describing elements 802-820 in FIG. 8.

As shown in FIG. 8, in addition to input connector sets 808 and 810, an additional input connector set 830 can be disposed along the third edge of base portion 802. This additional input connector set 830 can be the same or different that input connector sets 808 and 810. Further, as described above, this third input connector set 830 can be directly or selectively coupled to input connector sets 808, 810, and 812.

The additional input 830 thus provides additional flexibility for utilizing connection adapter 800 with a variety of different power supply configurations. For example, in FIGS. 3 and 4, the locations on each of the PSUs 304 and 404 for connector corresponding to input connector sets 308 and 310 is at a same first end of a long side of the PSUs 304 and 404 (e.g., a lower right hand corner, as shown in FIGS. 3 and 4). However in other embodiments, the location of a connector on a PSU can vary and can be on any side of a PSU and at an location along such a side. Therefore, to provide a greatest amount of flexibility in use, the connector adapter 800 is provide with the additional input connector set 830 to allow use with a largest number of PSU configurations, including PSUs of different sizes and shapes and different connector configurations.

Further, the present disclosure contemplates that the locations of input connector sets 808, 810, 830 in FIG. 8 and input connector sets 208 and 210 in FIGS. 2A-2C along the edges of base portions 802 and 202, respectively, are not limited to such locations. For example, in some embodiments, the locations of one or more of input connector sets along the edges of a base portion can be different from that shown in FIGS. 2A-2C and FIG. 8. Additionally, the present disclosure also contemplates that the number of connectors along any of the edges a base portion can also vary. For example, in each of connector adapters 200 and 800, the input connectors can be located such that any of the three edges of base portions 202 and 802, respectively, support two or more input connector sets.

Although, the various embodiments have been discussed primarily with respect to connection adapters configured as power adapters, the various embodiments are not limited in this regard. The same design principles can be applied to provide connection adapters for providing any other types of adapters, These include, but are not limited to communication adapters, data storage/data transfer adapters, video adapters, and human/computer interface adapters, to name a few. In such configurations, additional components and circuitry for supporting the particular types of signals for the particular adapter type can be provided.

While various embodiments of the present technology have been described above, it should be understood that they have been presented by way of example only, and not limitation. Numerous changes to the disclosed embodiments can be made in accordance with the disclosure herein without departing from the spirit or scope of the present technology. Thus, the breadth and scope of the present technology should not be limited by any of the above described embodiments. Rather, the scope of the present technology should be defined in accordance with the following claims and their equivalents.

Although the present technology has been illustrated and described with respect to one or more implementations, equivalent alterations and modifications will occur to others skilled in the art upon the reading and understanding of this specification and the annexed drawings. In addition, while a particular feature of the present technology may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the present technology. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising." The terms "approximately," "substantially" and variants thereof are used in either the detailed description and/or the claims with respect to particular values are intended to refer to being within 20% of the stated value.

Unless otherwise defined, all terms (including technical and scientific terms) used herein have the same meaning as commonly understood by one of ordinary skill in the art to which this present technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A printed circuit board, comprising:
a substantially rectangular base portion comprising a plurality of sets of input connectors;
a first output portion extending from a first end of the base portion in a first direction and comprising a first set of output connectors at a distal end of the first output portion; and
a second output portion extending from the first end of the base portion in a second direction and comprising a second set of output connectors at a distal end of the second output portion; and
wherein the plurality of sets of input connectors are electrically coupled to each of the first set of output connectors and the second set of output connectors, wherein the first direction and the second direction are substantially perpendicular to each other, and wherein the base portion extends away from the first output portion and the second output portion in a third direction that is not substantially perpendicular to the first direction or the second direction.

2. The printed circuit board of claim 1, wherein the third direction and at least one of the first direction and the second direction are separated by about 120 degrees to about 130 degrees.

3. The printed circuit board of claim 1, wherein the plurality of sets of input connectors comprise at least one first set of input connectors disposed along one or more edges of the base portion and at least one second set of input connectors disposed on a major surface of the base portion.

4. The printed circuit board of claim 1, wherein the plurality of sets of input connectors comprise a first set of input connectors at a first of the edges of the base portion and a second set of input connectors at a second of the edges of the base portion.

5. The printed circuit board of claim 4, wherein the first and the second of the edges are adjacent edges of the base portion.

6. The printed circuit board of claim 4, wherein the plurality of sets of input connectors further comprise a third set of input connectors at a third of the edges of the base portion.

7. The printed circuit board of claim 4, wherein at least of the plurality of sets of input connectors are of a same connector type.

8. The printed circuit board of claim 1, wherein the first set of output connectors comprises a plug connector.

9. The printed circuit board of claim 1, wherein the second set of output connectors comprises a bus bar connector.

10. The printed circuit board of claim 1, further comprising a set of power transfer terminals electrically coupled to the plurality of sets of input connectors, the first set of output connectors, and the second set of output connectors.

11. A connection adapter, comprising:
an input portion comprising a plurality of sets of input connectors;
a first output portion extending from the input portion in a first direction and comprising a first set of output connectors; and
a second output portion extending from the input portion in a second direction and comprising a second set of output connectors,
wherein the plurality of sets or input connectors are electrically coupled to each of the first set of output connectors and the second set of output connectors, wherein the first direction and the second direction are substantially perpendicular to each other, and wherein the input portion extends in a third direction that is not substantially perpendicular to the first direction or the second direction.

12. The connection adapter of claim 11, wherein the plurality of sets of input connectors comprise at least one first set of input connectors of a first type and at least one second set of input connectors of a second type different than the first type.

13. The connection adapter of claim 11, wherein the plurality of sets of input connectors comprise a first set of input connectors facing a first direction and a second set of input connectors facing in a second direction.

14. The connection adapter of claim 13, wherein the first direction and the second direction are substantially perpendicular.

15. The connection adapter of claim 13, wherein the first set of input connectors and the second set of input connectors are of a same connector type.

16. The connector adapter of claim 13, wherein the plurality of sets of input connectors further comprise a third set of input connectors facing a third direction opposite to the first direction and perpendicular to the second direction.

17. The connection adapter of claim 11, wherein the first set of output connectors and the second set of output connectors are of different connector types.

18. The connection adapter of claim 17, wherein the first set of output connectors comprises a plug connector.

19. The connection adapter of claim 17, wherein the second set of output connectors comprises a bus bar connector.

20. The connection adapter of claim 11, further comprising a set of power transfer terminals electrically coupled to the plurality of sets or input connectors, the first set of output connectors, and the second set of output connectors.

21. The connection adapter of claim 11, first comprising at least one of components and circuitry from controlling or adjusting electrical signals output to at least one of the first set of output connectors or the second set of output connectors.

22. The connection adapter of claim 11, wherein the input portion, the first output portion, and the second output portion are formed in a printed circuit board.

* * * * *